(12) United States Patent
Roth et al.

(10) Patent No.: US 10,374,858 B2
(45) Date of Patent: Aug. 6, 2019

(54) TRANSCEIVING SYSTEM USING A JOINED LINEAR ORTHOGONAL MODULATION

(71) Applicant: COMMISSARIAT A L'ENERGIE ATOMIQUE ET AUX ENERGIES ALTERNATIVES, Paris (FR)

(72) Inventors: Yoann Roth, Grenoble (FR); Vincent Berg, Corenc (FR); Jean-Baptiste Dore, Fontanil-Cornillon (FR); Laurent Ros, Domene (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/914,137

(22) Filed: Mar. 7, 2018

(65) Prior Publication Data
US 2018/0262379 A1    Sep. 13, 2018

(30) Foreign Application Priority Data
Mar. 9, 2017    (FR) ...................... 17 51927

(51) Int. Cl.
*H04L 27/10* (2006.01)
*H04L 27/26* (2006.01)
(Continued)

(52) U.S. Cl.
CPC ...... *H04L 27/2636* (2013.01); *H03M 13/258* (2013.01); *H03M 13/2957* (2013.01); *H03M 13/2996* (2013.01); *H04L 1/005* (2013.01); *H04L 1/006* (2013.01); *H04L 1/0041* (2013.01); *H04L 1/0066* (2013.01); *H04L 1/0068* (2013.01); *H04L 1/0071* (2013.01); *H04L 25/03171* (2013.01); *H04L 25/4902* (2013.01); *H04L 27/32* (2013.01); *H04L 27/02* (2013.01); *H04L 27/10* (2013.01)

(58) Field of Classification Search
CPC ... H04L 1/006; H04L 1/0068; H04L 27/2636; H04L 1/0071; H03M 13/2957
USPC .................. 375/272, 295, 316, 341; 714/795
See application file for complete search history.

(56) References Cited

U.S. PATENT DOCUMENTS

| | | | |
|---|---|---|---|
| 2005/0111347 A1* | 5/2005 | Breiling ............... | H04B 7/0669 370/206 |
| 2009/0232242 A1* | 9/2009 | Xiong .................. | H04L 1/0041 375/265 |

OTHER PUBLICATIONS

French Preliminary Search Report dated Nov. 24, 2017 in French Application 17 51927, filed Mar. 9, 2017 (with English Translation of Categories of Cited Documents).
(Continued)

*Primary Examiner* — Khai Tran
(74) *Attorney, Agent, or Firm* — Oblon, McClelland, Maier & Neustadt, L.L.P.

(57) ABSTRACT

A transceiving system using a joined modulation alphabet A having a size M the symbols of which are distributed on a plurality N of orthogonal dimensions, the symbols carried by a dimension belonging to a linear sub-alphabet $A_n$ having a size P, with M=NP. The transmitter performs a turbocoding of a block of information bits, the code words provided by the turbocoder being mapped to symbols of the joined modulation alphabet before modulating the signal to be transmitted. The receiver performs turbodecoding from the projection of the symbols received on the orthogonal dimensions of the alphabet.

17 Claims, 6 Drawing Sheets

(51) Int. Cl.
*H03M 13/29* (2006.01)
*H04L 1/00* (2006.01)
*H04L 25/49* (2006.01)
*H04L 27/32* (2006.01)
*H04L 25/03* (2006.01)
*H03M 13/25* (2006.01)
*H04L 27/02* (2006.01)

(56) References Cited

OTHER PUBLICATIONS

Yoann Roth et al. "Turbo-FSK: A New Uplink Scheme for Low Power Wide Area Networks", 2015 IEEE 16th International Workshop on Signal Processing Advances in Wireless Communications (SPAWC). Jun. 28, 2015, XP0336213207, 5 pages.

Rui Alves et al. "Coding of PPM Based Modulation Techniques to Improve the Performance of Infrared WLAN's", Vehicular Technology Conference, Sep. 24-28, 2000, XP010524715, pp. 1345-1352.

Kaimin Wang et al. "A Novel Trellis Coded Overlapping Amplitude and Pulse Position Modulation Scheme for Gamma-Gamma Channel Free-Space Optical Communication", China Communications, China Institute of Communications, vol. 13, No. 4, Apr. 1, 2016, XP011611358, pp. 58-69.

Li Ping et al. "Low-Rate Turbo-Hadamard Codes", IEEE Transactions on Information Theory, vol. 49, No. 12, Dec. 2003, pp. 3213-3224.

* cited by examiner $P = 4$

TRANSCEIVING SYSTEM USING A JOINED LINEAR ORTHOGONAL MODULATION

TECHNICAL FIELD

The present invention generally relates to the field of machine to machine or M2M communications within the context of the Internet of Things (IoT) and more particularly that of low rate and low energy requiring communications.

STATE OF PRIOR ART

The development of M2M communications within the context of the Internet of things, in particular in LPWAN networks (Low Power Wide Area Networks) has stimulated the search for a technology capable of combining low consumption and low sensitivity level, so as to meet in particular energy consumption requirements at the terminals.

The technologies currently contemplated to fulfil these specifications are of two types.

The first type consists of very narrow band transmissions enabling the noise power to be minimised upon reception and thus the signal to noise ratio to be increased in the band. The systems of this category generally suffer from problems inherent to the length of the transmission blocks, in particular clock tracking and compensation for channel variations (the channel cannot be considered as static during the transmission of a block).

The second type consists of systems capable of operating at low signal to noise ratio levels using low spectral efficiency modulation and/or coding schemes. The orthogonal modulations with order M are well adapted to low rate and low energy requiring communications. They enable high energy efficiency levels (expressed in bits/Joule) to be obtained which reach the Shannon performance limit when the size M of the alphabet tends to infinity. However, they correlatively result in spectral efficiency levels (expressed in bits/s/Hz) which tend to zero when the size of the alphabet tends to infinity. The use of a large size alphabet results in very long duration waveforms, only compatible at excessively low rates. An alternative to increase the energy efficiency of the transmission without excessively reducing the spectral efficiency is to use a channel coding and in particular a turbocoding together with an orthogonal modulation.

A first example of a combination of an orthogonal modulation with a turbocode is described in the paper by L. Ping et al. entitled "Low rate turbo-Hadamard codes" published in IEEE Trans. on Information Theory, vol. 49, No. 12, pp. 3213-3224, December 2003. The modulation used is a modulation by Hadamard sequences. This coding and modulation scheme, called Turbo-Hadamard, makes it possible to approach the Shannon performance limit near 0.29 dB but for blocks having a size higher than $10^6$ bits. Thus, the Turbo-Hadamard scheme is not adapted to low rate transmissions as those occurring in the LPWAN networks.

A second example of a combination of an orthogonal modulation with a turbocode is described in the paper by Y. Roth et al. entitled "Turbo-FSK: a new uplink scheme for Low Power Wide Area Network" published in Proc. of the IEEE 16th Int'l Workshop on Signal Processing Advances in Wireless Communications (SPAWC), June 2015, pp. 81-85. The modulation used is a FSK (Frequency Shift Keying) modulation in place of the modulation by Hadamard sequence. The corresponding scheme is called Turbo-FSK for that reason.

FIG. 1 schematically represents the structure of a transmitter using a Turbo-FSK scheme.

The transmitter comprises a plurality of K branches in parallel, 110, each branch encoding an interleaved version of the information bits. More precisely, the information bits to be transmitted are gathered as blocks having a size Q=q×r, in other words each block is comprised of q words having r bits, that can be further represented by a matrix D having a size q×r. The block D is provided as such to the first branch and is successively interleaved by the interleavers $\Pi_1, \ldots, \Pi_{K-1}$, each output of an interleaver providing an interleaved version of the block to a corresponding branch.

Each branch comprises a module, 120, consisting of a systematic convolutional coder associated with a FSK modulator. The structure of the modules 120 is identical and has been schematically represented in FIG. 2.

The systematic convolutional coder (the r information bits are coded as such), 210, adds a parity bit, calculated as the sum of the systematic bits and the parity bit of the preceding word. The code word having a size r+1, consisting of the r systematic bits and the parity bit, is provided to the FSK modulator, 220. More precisely, each word having r+1 bits is mapped to a symbol S of the FSK alphabet having a size $M=2^{r+1}$. In other words, a frequency shifting among M possible shiftings is associated with each word having r+1 bits. The symbols of the FSK alphabet are for example the rows of a DFT (Discrete Fourier Transform) matrix having a size M×M.

Turning back to FIG. 1, for each word of the block, the K branches 120 provide the FSK symbols, noted $S^{(0)}$, $S^{(1)}, \ldots, S^{(K-1)}$ to a parallel/series converter, 130, and the flow of FSK symbols thus obtained is used to modulate a carrier.

Given that it is necessary to close the trellis of the convolutional coders with a further word (to reset the status register to 0), the spectral efficiency of the transmitter is finally:

$$\eta = \frac{qr}{(q+1)MK} \approx \frac{r}{K2^{r+1}} \quad (1)$$

the approximation is valid for large block sizes. It is understood that the spectral efficiency, even if it is adapted to the LPWA network, remains very low ($\eta=\frac{1}{8}$ for the minimal values r=1 and K=2). An operation at higher spectral efficiencies can be necessary depending on the application, or in situations where the communication range is less restricted.

The purpose of the present invention is consequently to provide a transceiving system for a LPWA network which makes it possible to reach higher rates than those of prior art while having a high spectral efficiency. A subsidiary purpose of the present invention is to be able to offer flexibility between energy efficiency and spectral efficiency for a transmission in a LPWA network.

DISCLOSURE OF THE INVENTION

The present invention is defined by a transmitter for transmitting a block of Q bits, said transmitter comprising a turbocoder receiving said block and providing K code words having m bits, the turbocoder comprising K branches, each branch receiving said block and comprising a first interleaver for interleaving the bits of the block, followed by an elementary coder coding each word having r bits at the output of the first interleaver into a code word having m=r+c bits where c is a non-null integer, the turbocoder being followed by a modulator mapping each code word having m bits at the output of the turbocoder into a symbol of a modulation alphabet A having a size $M=2^m$, the symbols of the modulation alphabet provided by the modulator modulating the signal to be transmitted, the symbols of the modulation alphabet A being distributed on a plurality N of orthogonal dimensions, the symbols carried by a dimension belonging to a linear sub-alphabet $A_n$, having a size P>1, with M=NP.

Preferably, each elementary coder comprises a convolutional coder with a rate $$\frac{r+1}{m},$$

the elementary coder receiving a word with r bits, calculating a parity bit of said word and concatenating it to the same to provide a word with r+1 bits, the convolutional coder coding said word having r+1 bits into a code word having m bits.

The code words provided by the elementary coder are advantageously interleaved by a second interleaver for interleaving the code words between them.

The second interleaver provides the interleaved code words to a puncturer, all the puncturers of the different branches performing a word puncturing of the code words with a predetermined puncturing rate $R_{punc}>1$.

The modulation symbols of the modulation alphabet A are typically defined by $x^k = z_p f^n$, $k \in \{0, \ldots, NP-1\}$, where $f^n = (f_0^n, f_1^n, \ldots, f_{N-1}^n)^T$ is a vector having a size N representing a symbol of an orthogonal modulation alphabet and $z_p \in \{z_0, \ldots, z_{P-1}\}$ is a symbol of a linear modulation alphabet.

According to a first alternative, the orthogonal modulation alphabet consists of modulation symbols N-FSK.

According to a second alternative, the orthogonal modulation alphabet consists of Hadamard sequences having a size N.

According to a third alternative, the linear modulation alphabet consists of symbols P-PSK.

The invention also relates to a receiver for receiving a signal transmitted by the transmitter previously defined, the signal received by the receiver being base-band demodulated to provide a block of successive received symbols, the receiver comprising a series-parallel converter receiving the successive received symbols and providing them to a plurality K of parallel branches, each branch ($\ell$) comprising a detection module (730, 830) adapted to project a symbol ($\mathbf{y}^\ell$) received on this branch onto the N orthogonal dimensions of the modulation alphabet A to obtain a vector having N components $(Y_0^\ell, Y_1^\ell, \ldots, Y_{N-1}^\ell)$ and deduce therefrom as a word having NP soft values the logarithm of the observation probabilities $(\log[p(\mathbf{y}\mathbf{y}^\ell | x^k)])$ of the received symbol assuming that the different symbols of the modulation alphabet have been transmitted, the detection module providing the words thus obtained to an elementary decoder, the elementary decoders of the different branches being chained together so as to perform turbodecoding, the turbo-decoding providing probability logarithmic ratios, called LR values, for the different information bits of the block, the information bits of the block being estimated by a hard decision on the LR values thus obtained.

Preferably, for a given branch, the words provided by the detection module are depunctured by a depuncturing module, the block of words thus depunctured being deinterleaved in a word deinterleaving module performing the inverse of the word interleaving performed in the corresponding branch of the transmitter.

The detection module of a branch $\ell$ advantageously calculates the NP soft values corresponding to a symbol $\mathbf{y}^\ell$ received from $$-\frac{N}{2\sigma^2}|z_p|^2 + \frac{1}{\sigma^2}\mathrm{Re}(Y_n^\ell \bar{z}_p),$$

$n=0, \ldots, N-1$, $p=0, \ldots, P-1$, where $Y_n^\ell$ is the component of the received symbol, $\mathbf{y}^\ell$, on the $n^{th}$ dimension of the modulation alphabet, $z_p$ is a linear modulation symbol carried by the $n^{th}$ dimension of the modulation alphabet, $\bar{z}_p$ is the conjugate of $z_p$, and $\sigma^2$ is the noise power received.

According to a first alternative, the orthogonal modulation is a FSK modulation and the components $Y_n^\ell$ of the received symbol $\mathbf{y}^\ell$ are obtained by correlating the received symbol with the different rows of a DFT matrix having a size N×N.

According to a second alternative, the orthogonal modulation is a Hadamard modulation and the components $Y_n^\ell$ of the received symbol $\mathbf{y}^\ell$ are obtained by correlating the received symbol with the different rows of a Hadamard matrix having a size N×N.

The elementary decoder of a branch $\ell$ advantageously comprises a summing block performing the sum of the NP soft values $$-\frac{N}{2\sigma^2}|z_p|^2 + \frac{1}{\sigma^2}\mathrm{Re}(Y_n^\ell \bar{z}_p),$$

$n=0, \ldots, N-1$, $p=0, \ldots, P-1$, of a word and of an a priori piece of information provided on the modulation symbols representing the a priori probability that the different modulation symbols have been transmitted, to give an a posteriori piece of information representing the probability that the different modulation symbols have been transmitted in view of the observation of the symbol $\mathbf{y}^\ell$ received by the branch $\ell$.

The a priori piece of information on the modulation symbols is advantageously obtained by a conversion module from an a priori piece of information on the information bits provided by the branch $\ell-1$.

The elementary decoder of a branch $\ell$ further comprises a BCJR decoding module using the coding trellis of the elementary coder corresponding to the transmitter to determine, from the a posteriori piece of information on the different symbols, an a posteriori piece of information on the different information bits representing the a posteriori probability of said different information bits.

The a priori piece of information on the different information bits provided by the branch $\ell-1$ is subtracted from the a posteriori piece of information on the different information bits to determine an extrinsic piece of information, said extrinsic piece of information being subtracted from a following iteration of the a priori piece of information on the different information bits at the input of the conversion module.

DETAILED DISCLOSURE OF PARTICULAR EMBODIMENTS

Figure 1:
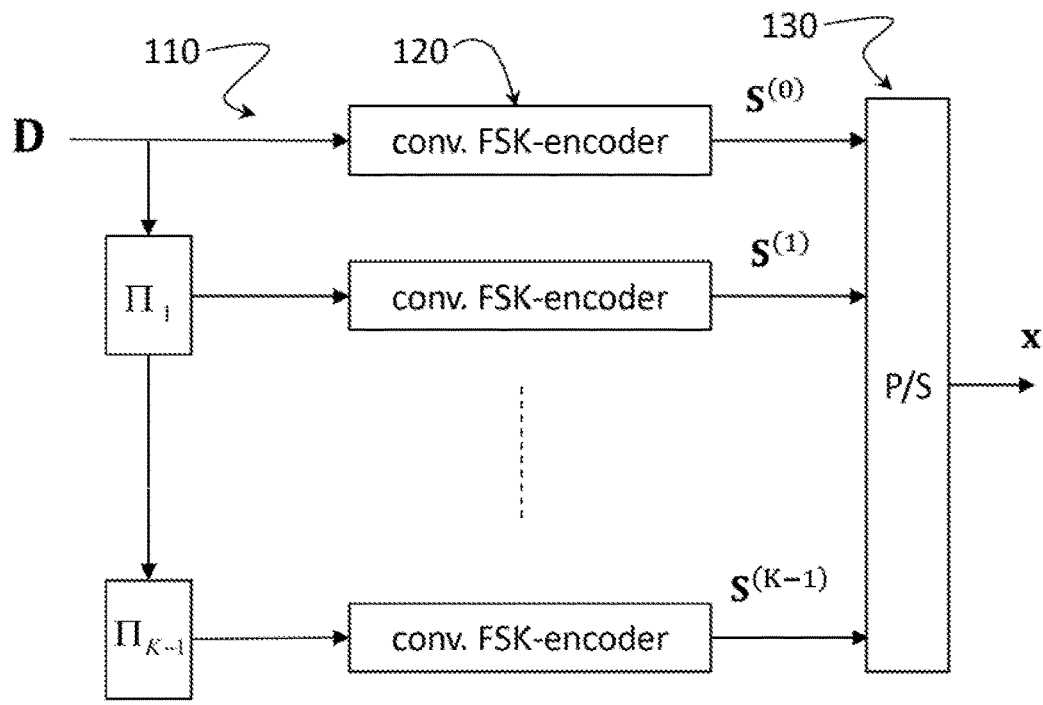
FIG. 1 schematically represents the structure of a Turbo-FSK transmitter known to the state of the art.
Figure 2:
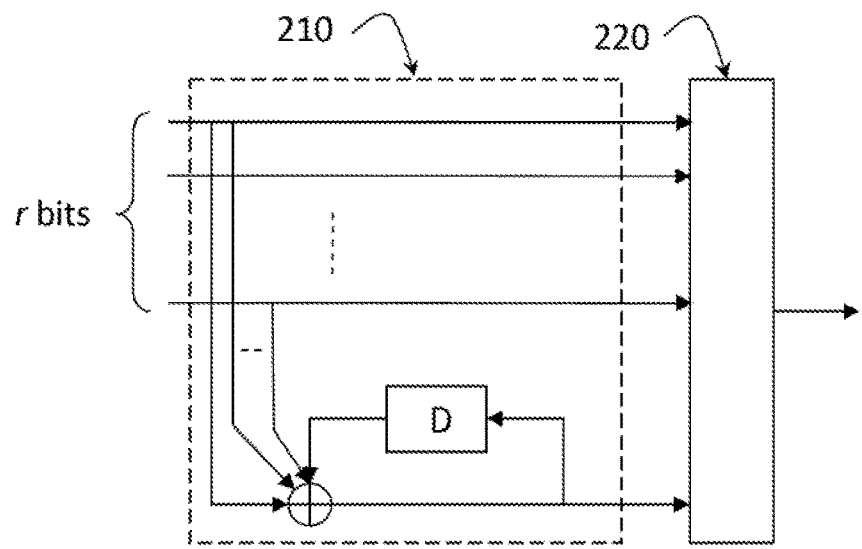
FIG. 2 schematically represents the detail of a module of the transmitter of FIG. 1.

The idea underlying the present invention is to resort to a joint (or hybrid) modulation, that is both linear and orthogonal. Generally, a modulation operation consists in associating with a binary word, a modulation symbol consisting of a complex symbol or a sequence of complex symbols.

The set of modulation symbols is called a modulation alphabet. A modulation alphabet A having a size M enables up to $\lfloor \log_2(M) \rfloor$ distinct binary words to be represented.

The alphabet A is referred to as orthogonal if:

$$\forall a_i \in A, \forall a_j \in A, \text{ there is } \langle a_i | a_j \rangle = M \text{ if } i=j \text{ and}$$
$$\langle a_i | a_j \rangle = 0 \text{ if } i \neq j \quad (2)$$

where $\langle .|. \rangle$ is a dot (scalar) product. When a modulation uses an orthogonal alphabet, the modulation is referred to as an orthogonal modulation. Examples of orthogonal modulation are the modulation by Hadamard sequences, the FSK modulation, the PPM modulation (Pulse Position Modulation). In the first case, the alphabet A consists of the rows of a Hadamard matrix, in the second case, of the rows of a discrete Fourier (DFT) matrix and in the last case, for example, of the set $\{\delta(t-mT); m=0, \ldots, M-1\}$ where $\delta(.)$ is the Dirac function and T the time interval between successive modulation positions.

In practice, when a symbol of an orthogonal alphabet is transmitted by the transmitter, the demodulation can be performed (non-coherent demodulation) by projecting the received modulated signal onto the different symbols of the alphabet, in other words by calculating the scalar product of the symbol received with the different symbols of the alphabet. The scalar product with the highest absolute value thereby provides the most probable modulation symbol.

The alphabet A is referred to as a linear alphabet if the modulation symbols are all multiples of a symbol of A by a complex coefficient. When a modulation uses a linear alphabet, the modulation will be referred to as a linear modulation. Examples of linear modulation are the amplitude shift keying (ASK) modulation or even the phase shift keying (PSK) modulation.

Orthogonal modulations and linear modulations behave in an opposite way in terms of spectral efficiency and energy efficiency. Indeed, for a linear modulation, the spectral efficiency increases and the energy efficiency decreases with an increasing size M of the alphabet. Conversely, for an orthogonal modulation, the spectral efficiency decreases and the energy efficiency increases up to a maximum depending on the noise spectral density.

The present invention suggests to use a modulation alphabet only some symbols of which are orthogonal. More precisely, the alphabet A is distributed on N orthogonal dimensions, the group of symbols carried by a dimension n making up a sub-alphabet noted $A_n$ having the cardinal P. Consequently, there is the relationship M=N×P.

The symbols of the alphabet A satisfy:

$$\langle a_i | a_j \rangle = N\alpha_{i-j} \text{ if } \exists n \in \{0, \ldots, N-1\} \text{ such that } a_i, a_j \in A_n$$

$$\langle a_i | a_j \rangle = 0 \text{ else} \quad (3)$$

where $\alpha_{i-j}$ is a complex number representing the deviation between two symbols $a_i$ and $a_j$ belonging to a same sub-alphabet (same dimension n). In other words, two symbols belonging to distinct sub-alphabets $A_n$ are orthogonal to each other whereas two symbols belonging to a same sub-alphabet are multiple to each other by a complex coefficient.

A modulation using an alphabet satisfying the condition (3) is called a joint (or hybrid) modulation. It has the properties of a linear modulation within a same dimension and the properties of an orthogonal modulation between the different orthogonal dimensions.

Figure 3:
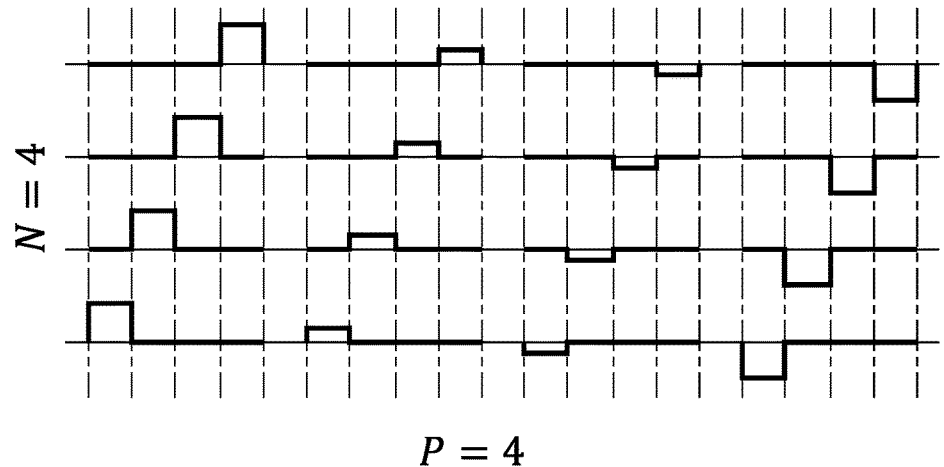
FIG. 3 represents an example of joint modulation alphabet.

FIG. 3 represents an example of joint modulation with N=4 and P=4. In other words, the alphabet includes 4 orthogonal dimensions, here 4 time positions of a 4-PPM (Pulse Position Modulation), and 4 symbols per dimension corresponding to the 4 levels of a 4-ASK or 4-PAM (Pulse Amplitude Modulation). The full alphabet thus includes 16 symbols, each symbol corresponding to a time position (orthogonal relationship) and an amplitude level (linear relationship). It is noted in FIG. 3 that the sub-alphabets A consist of the symbols carried by a same row and that the orthogonal dimensions are the different rows.

A joint modulation having N orthogonal dimensions and P modulation symbols per orthogonal dimension corresponds to a spectral efficiency:

$$\eta = \frac{\log_2(M)}{N} = \frac{\log_2(N) + \log_2(P)}{N} \quad (4)$$

which is higher than the spectral efficiency of a single orthogonal modulation because of the presence of the term $\log_2(P)$. However, the presence of non-orthogonal modulation symbols results in a significant increase in the bit error rate for a same signal to noise ratio.

Figure 4:
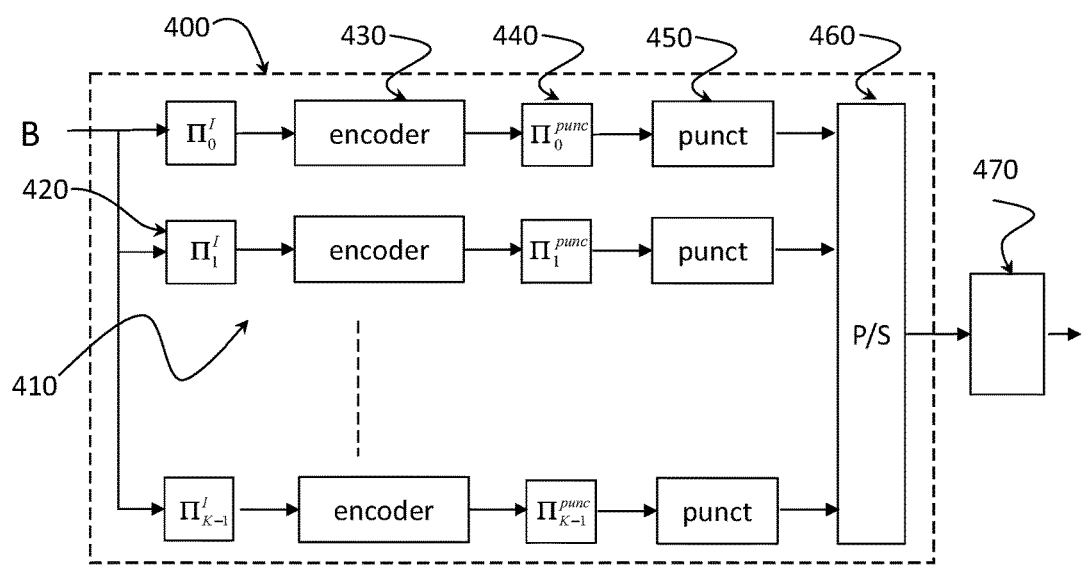
FIG. 4 schematically represents the structure of a transmitter according to one embodiment of the invention.

FIG. 4 schematically represents the structure of a transmitter according to one embodiment of the invention.

The transmitter comprises a turbocoder 400 followed by a modulator 470 mapping the code words to joint modulation symbols.

The turbocoder comprises a plurality K of branches in parallel, 410, each branch encoding an interleaved version of the information bits. The information bits to be transmitted are gathered as blocks B having a size Q=q×r, optionally, after they have been completed by padding bits (for example zero padding). Each block is interleaved (at the bit level) by the interleavers $\Pi_0^I, \ldots, \Pi_{K-1}^I$, designated by 420 and respectively located at the input of each of the K branches 410.

Since the K branches 410 have all the same structure, it is sufficient to describe a branch with the index $\ell=0, \ldots, K-1$. This branch comprises an interleaver performing bit interleaving on the blocks having a size Q=q×r. Each word having r bits at the output of the interleaver is then convolutionally coded. More precisely, the flow of bits at the output of the interleaver $\Pi_\ell^I$ is provided to an elementary coder, 430.

Figure 5:
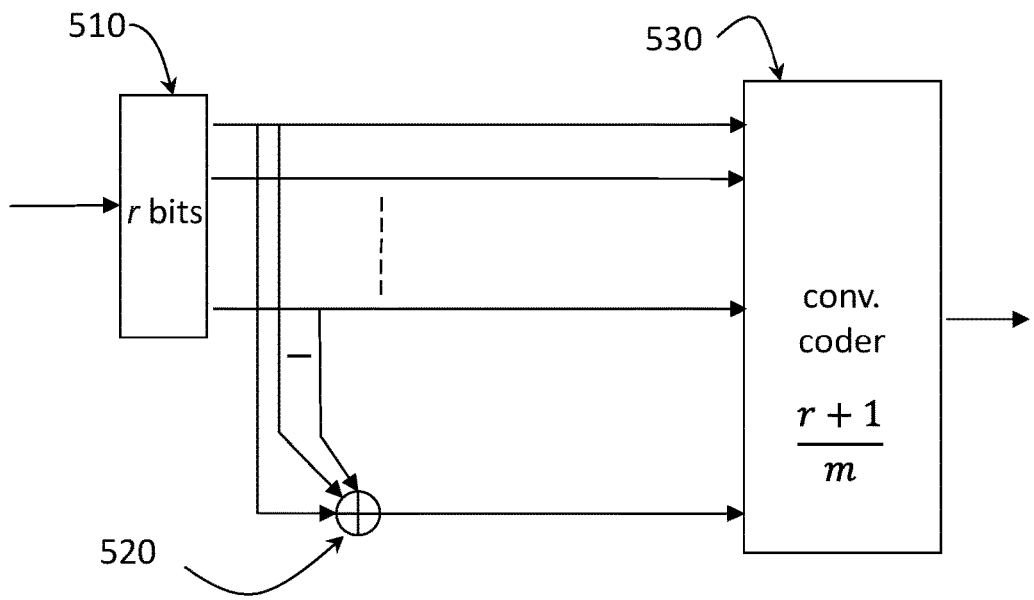
FIG. 5 schematically represents the detail of a module of the transmitter of FIG. 4.

The structure of the elementary coder 430 is schematically represented in FIG. 5.

The bits at the input of the elementary coder (from the interleaving of a block) are gathered as words having a size r in 510. For each word, a parity bit is calculated by summing in 520 the r information bits. The word having a size r+1 resulting from concatenating the input word and the parity bit thus calculated is provided to a convolutional coder, 530, having the rate $$\frac{r+1}{m}.$$

In other words, for each word having a size r+1 at the input of the convolutional coder, this provides at the output a code word having the size m. The global rate of the elementary coder is consequently $$\frac{r}{m}.$$

The elementary coder can be systematic or not. When it is systematic, the code word at the output of the coder is comprised of the r information bits of the input word and c=m−r parity bits.

The convolutional coder conventionally consists of a shift register with L memory locations and a combinatory logic. To reset the register to zero and close the coding trellis, a plurality L of words having m bits calculated depending on the status of the memories after encoding the q words is inserted at the end of the block. Thus, finally, a block of q×r bits is transformed by the elementary coder into a block of (q+L)m bits. The rate of the code is consequently:

$$R_c = \frac{qr}{(q+L)m} \quad (5)$$

The code words (having a size m) at the output of the elementary coder 430 are optionally interleaved in 440, the interleaving being made at the words (and not at the bits within a word). The word interleavers are referred to as $\Pi_0^{punc}, \ldots, \Pi_{K-1}^{punc}$.

The code words at the output of the elementary coder, 430, or of the word interleaver, 440, if present, are then punctured in 450. The puncturing is made here on full words (and not on bits), in other words the puncturers 450 are word puncturers. The puncturing rate represents the ratio of the number of code words at the input to the number of code words at the output of the puncturer. It is noted $R_{punc}$ in the following with $R_{punc} > 1$.

Figure 6:
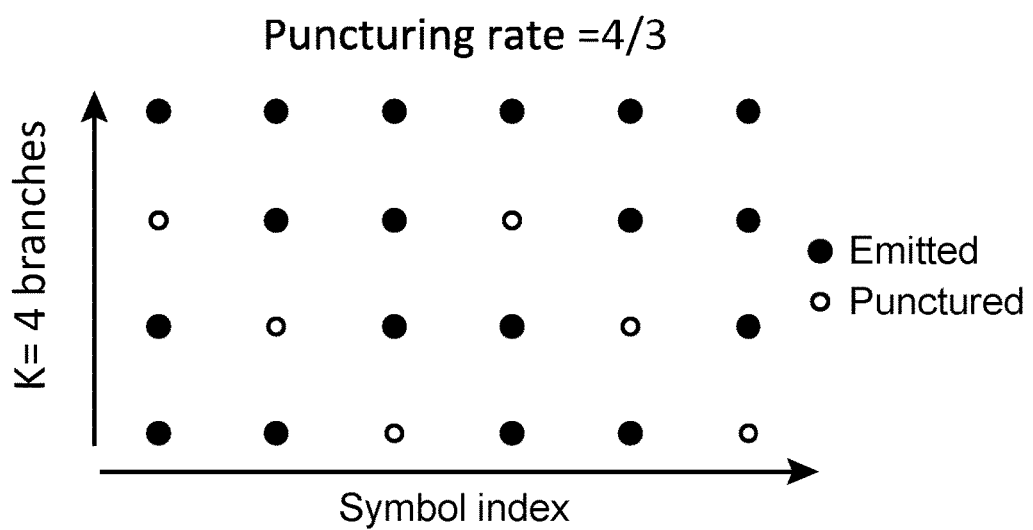
FIG. 6 represents an example of puncturing scheme used in the transmitter of FIG. 4.

FIG. 6 represents an example of puncturing scheme used for the different branches of the transmitter. The rows correspond here to the different branches of the transmitter (K rows) and the columns correspond to the successive words. The interleaving and puncturing schemes are chosen such that the systematic bits (the q×r information bits of the block) are present at least once at the output of one of the branches.

The K word flows at the output of the puncturers 450 of the different branches are converted in a single flow of code words by means of a parallel series converter, 460.

The successive code words at the output of the parallel series converter 460 are then mapped by the modulator 470 to modulation symbols of a joint modulation alphabet in the sense previously defined.

The modulation alphabet has the size $M=2^m$ with M=N×P where N is the number of orthogonal dimensions and P the number of symbols per sub-alphabet $A_n$.

The spectral efficiency is thereby given by:

$$\eta = \frac{qr}{(q+L)m} R_{punc} \frac{m}{N} \frac{1}{K} = \frac{qr}{(q+L)NK} R_{punc} \approx \frac{r}{NK} R_{punc} \quad (6)$$

the approximation being valid for large block sizes Q. Insofar as the number N of orthogonal dimensions is substantially lower than 2', the spectral efficiency is higher than that given by the expression (1) because of the contribution brought by the linear modulation. Further, the degradation in performance in terms of BER (Bit Error Rate) or PER (Packet Error Rate) as a function of the signal to noise ratio, due to the linear modulation, is compensated by the use of a turbocoding.

To perform the joint modulation, a modulation by Hadamard sequences (orthogonal modulation) and a PSK modulation (linear modulation) could for example be combined. According to a first alternative, a FSK modulation (orthogonal modulation) and a PSK modulation (linear modulation) could be combined. According to a second alternative, a FSK modulation (orthogonal modulation) could be combined with an APSK (Amplitude Phase Shift Keying) modulation (linear modulation).

Figure 7:
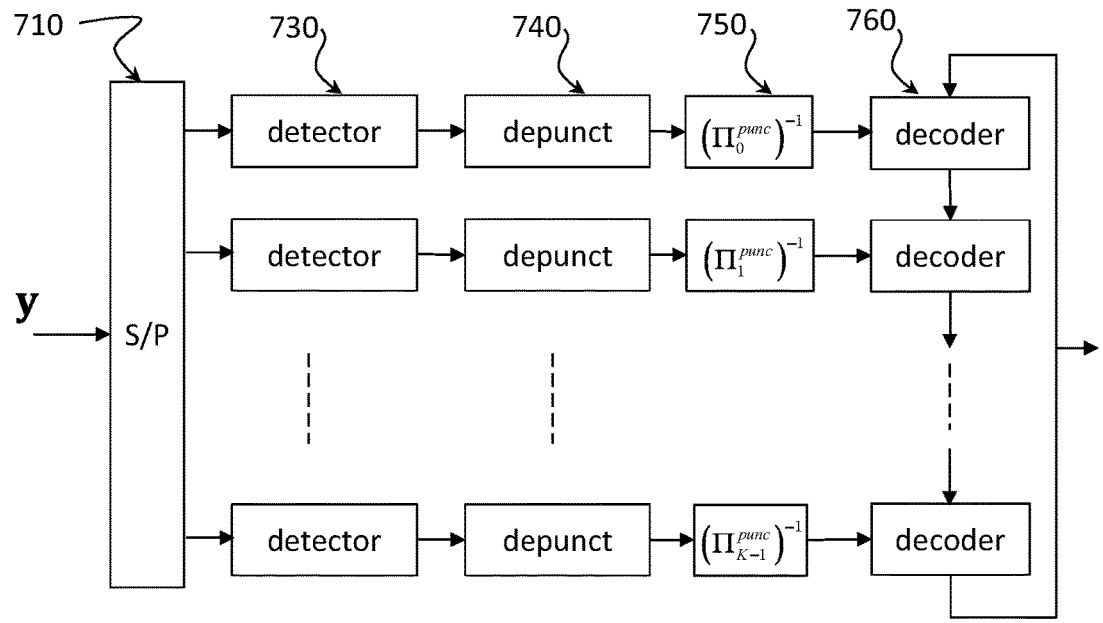
FIG. 7 schematically represents the structure of a receiver according to one embodiment of the invention.

FIG. 7 schematically represents the structure of a receiver according to one embodiment of the invention.

It is reminded beforehand that a joint modulation symbol transmitted by the transmitter 400 can be represented by a vector $x^k$ with $k \in \{0, \ldots, NP-1\}$ having the dimension N:

$$x^k = z_p f^n \quad (7)$$

where k=nP+p and $f^n = (f_0^n, f_1^n, \ldots, f_{N-1}^n)^T$ is a vector having a size N representing a symbol of the orthogonal alphabet and $z_p \in \mathbb{C}$ is a complex coefficient.

If it is assumed that the joint modulation symbol is transmitted on a Gaussian white additive channel, the corresponding signal received, after base-band demodulation, can be represented by a vector:

$$y = x^k + \chi \quad (8)$$

where χ is a vector the complex components of which are complex circular variables i.i.d, with a null mean and a variance equal to $\sigma^2$. The symbol y can be considered (in the same way as $x^k$) as a vector having a size N in the space underlied by the N orthogonal dimensions of the modulation alphabet. It represents a channel-noised joint modulation symbol.

The successive symbols y are provided to a series-parallel converter 710 to K outputs connected to K parallel processing branches 720. These K branches correspond to the K branches 410 of the transmitter, each branch $\mathbf{y}^\ell$ receiving a symbol noted $y\mathbf{y}^\ell$.

Each branch $\ell$ comprises a detection module 730 followed by a depuncturing module 740, an optional deinterleaving module 750, and an elementary decoder 760. The elementary decoders of the different branches are chained together so as to perform turbodecoding. More precisely, the elementary decoder of a branch with an index $\ell = 1, \ldots, K-1$ receives from the elementary decoder of the branch with an index $\ell - 1$, an a priori piece of information relating to the information bits of a block (having the size Q=qr) and provides to the elementary decoder of the branch with index an $\ell + 1$, an a posteriori piece of information on these information bits. The elementary decoder of the first branch (branch with an index 0) receives the a priori piece of information of the elementary decoder of the last branch (branch with an index K−1) and provides an a posteriori piece of information to the elementary decoder of the branch with an index 1.

Turbodecoding is made by a plurality of iterations on a block, each iteration comprising a sequence of decoding operations by the elementary decoders of the different branches of the receiver. When a stop criterion is satisfied (for example when a maximum number of iterations is reached, when the a posteriori piece of information relating to the block bits is higher in absolute value to a predetermined threshold or when the CRC is satisfied), turbodecoding terminates and the soft values obtained are provided to a decision module (not represented) giving an estimate of the information bits of the block considered.

Figure 8:
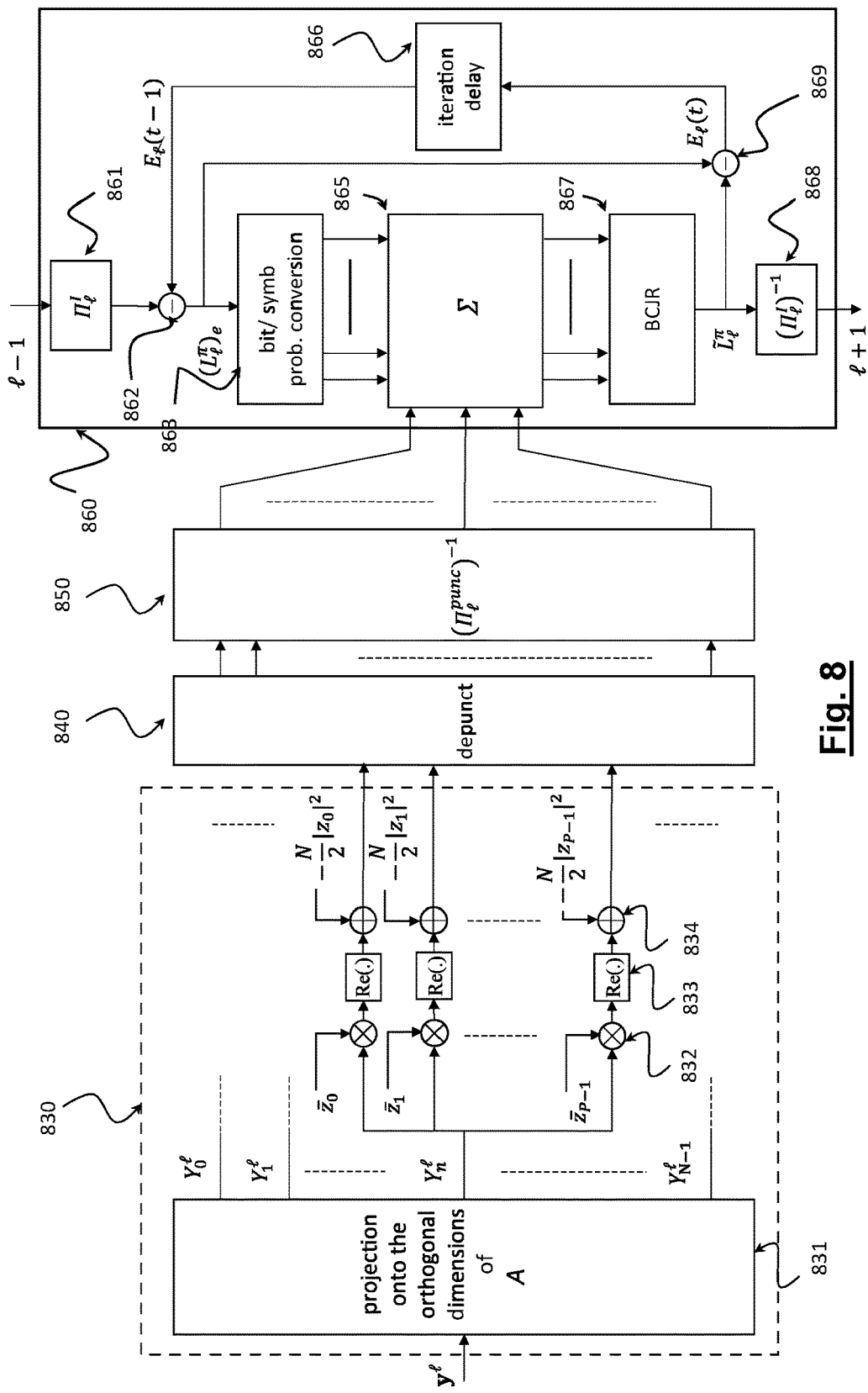
FIG. 8 schematically represents the detail of a branch of the receiver of FIG. 7.

FIG. 8 schematically represents the detail of a branch of the receiver of FIG. 7.

First, a symbol y corresponding to a channel-noised modulation symbol is considered as expressed in (8). As indicated above, the symbol y can be considered as a vector having a size N in the space underlied by the orthogonal dimensions of the alphabet.

The probability of observing the component $y_i$ of y at the output of the channel whereas the orthogonal component $x_i^k$ of the joint modulation symbol $x^k$ has been transmitted is expressed by the likelihood:

$$p(y_i | x_i^k) = \frac{1}{2\pi\sigma^2} \exp\left\{-\frac{1}{2\sigma^2}|y_i - x_i^k|^2\right\} = \qquad (9)$$
$$= \frac{1}{2\pi\sigma^2} \exp\left\{-\frac{|y_i|^2}{2\sigma^2}\right\} \exp\left\{-\frac{|x_i^k|^2}{2\sigma^2} + \frac{1}{\sigma^2}\langle y_i, x_i^k \rangle\right\}$$

where $\langle y_i, x_i^k \rangle = \mathrm{Re}(y_i \overline{x_i^k})$.

The likelihood of the vector y upon reception given that the joint modulation symbol $y^k$ has been transmitted is actually the likelihood product of its components:

$$p(y | x^k) = \prod_{i=0}^{N-1} p(y_i | x_i^k) \qquad (10)$$

In view of the expression (9) and making use of the construction of the joint modulation alphabet:

$$\sum_{i=0}^{N-1} |x_i^k|^2 = |z_p|^2 \sum_{i=0}^{N-1} |f_i^n|^2 = N|z_p|^2 \qquad (11)$$

this likelihood can be further written as:

$$p(y | x^k) = C \exp\left\{-\frac{N}{2\sigma^2}|z_p|^2 + \frac{1}{\sigma^2}\langle Y_n, z_p \rangle\right\} \qquad (12)$$

where C is a constant and $$Y_n = \sum_{i=0}^{N-1} y_i \overline{f_i^n}$$

is the projection of the vector y onto the $n^{th}$ dimension of the alphabet.

A noisy modulation symbol $\mathbf{y}^\ell$ is now considered, being provided (by the series-parallel converter 710) to the branch with an index $\ell$, more precisely to the detection module 830 of this branch. The vector $\mathbf{y}^\ell$ is first projected into the correlation module 831 on the N orthogonal directions of the alphabet to provide N orthogonal components, $Y_n^\ell$, n=0, ..., N−1, that is $$Y_n^\ell = \sum_{i=0}^{N-1} y_i^\ell \overline{f_i^n}$$

where $y_i \mathbf{y}^\ell$, i=0, ..., N−1 are the components of the vector $y\mathbf{y}^\ell$. It will be understood that this projection is made by correlating the received vector $\mathbf{y}^\ell$ with the different orthogonal modulation symbols $f^n$, n=0, ..., N−1. Thus, for example, if the orthogonal modulation is a FSK modulation, the different orthogonal projections are obtained by correlating the received signal with the sinusoids at the different FSK frequencies (in other words with the different rows of the DFT matrix).

The logarithm of the likelihoods of $\mathbf{y}^\ell$ are then calculated in the module 830 for the different modulation symbols of the alphabet $x^k$, k∈{0, ..., NP−1} that is, according to the expression (12), $$-\frac{N}{2}|z_p|^2 + \mathrm{Re}(Y_n^\ell \overline{z_p})$$

within the common factor $$\frac{1}{\sigma^2},$$

for n=0, . . . , N−1 and p=0, . . . , P−1.

To do this, each orthogonal component $Y_n^\ell$, n=0, . . . , N−1, is multiplied by $\bar{z}_p$, p=0, . . . , P−1, in 832, the real value is extracted therefrom in 833 and the term $$-\frac{N}{2}|z_p|^2$$

is subtracted therefrom in 834.

Consequently, it is understood that the detection module 830 finally provides, for each vector $yy^\ell$, a word of NP soft values log $[p(y^\ell|x^k)]$, k∈{0, . . . , NP−1} to the depuncturing module 840.

The depuncturing module 840 inserts for each word punctured in 450 at the transmitter (in other words for each punctured modulation symbol), a word of NP arbitrary soft values, preferably all equal to a predetermined value −log (NP), corresponding to a uniform likelihood distribution p($y^\ell|x^k$).

Thus, the depuncturing module 840 receives, for each block transmitted by the transmitter, $(q+L)/R_{punc}$ words of NP soft values and inserts $$(q+L)\left(1-\frac{1}{R_{punc}}\right)$$

further words having arbitrary soft values to provide a block of q+L words to the optional deinterleaving module 850.

The module 850 performs a reverse deinterleaving of the interleaving performed in 440 (if present). In other words, the module 850 of the branch $\ell$ performs the deinterleaving operation $(\Pi\ell^{punc})^{-1}$ if a word interleaving has been performed at the transmitter.

The block of q+L words thus deinterleaved is provided to the elementary decoder, 860. More precisely, it is understood that the words are provided one after another as the vectors $y^\ell$ are received, the elementary decoding operation only occurring when the q+L words have been received by the decoder.

It is reminded that each joint modulation symbol $x^k$ is associated with a word consisting of r information bits, that is $b^k=(b_\nu^k)_{\nu\in\{0,\ldots,r-1\}}$.

The function of the elementary decoder 860 is to provide an estimate of the a posteriori probabilities (with the knowledge of all the observations) of the information bits of the block transmitted. This estimate is conventionally made by means of soft values expressed as probability logarithmic ratios or LR (Log Ratio), that is:

$$L(b_\nu^k)=\log\frac{Pr(b_\nu^k=+1)}{Pr(b_\nu^k=-1)} \tag{13}$$

where $Pr(b_\nu^k=+1)$, resp. $Pr(b_\nu^k=-1)$ is the probability that the bit $b_\nu^k$ is equal to 0, (resp. equal to 1), with the representation convention 0→+1 and 1→−1.

It is reminded that the sign (hard decision) of the LR value gives the bit estimate and that the LR absolute value indicates the confidence level of this estimate.

The elementary decoder calculates the LR values of the block bits, from the LR values provided by the preceding elementary decoder (that is from the branch $\ell-1$) and the likelihoods calculated by the detection module 830 (after depuncturing and word deinterleaving).

The a posteriori probability (APP) that the symbol $x^k$ has been transmitted by the transmitter given that $y^\ell$ has been observed by the receiver is expressed from the a priori probability $Pr(x^k)$:

$$Pr(x^k|y^\ell)=\frac{p(y^\ell|x^k)Pr(x^k)}{Pr(y^\ell)} \tag{14}$$

On the other hand, the a priori probability $Pr(x^k)$ is actually the probability product of the bits $(b_\nu^k)_{\nu\in\{0,\ldots,r-1\}}$ of the word of r bits with which the joint modulation symbol $x^k$ is associated, in other words:

$$Pr(x^k)=\prod_{\nu=0}^{r-1}Pr(b_\nu^k). \tag{15}$$

It can be shown, according to the expression (13) that:

$$Pr(b_\nu^k)=\beta_\nu\exp(L(b_\nu^k)b_\nu^k/2) \tag{16}$$

where $\beta_\nu$ does not depend on the sign of $b_\nu^k$. In view of (14) and (16):

$$Pr(x^k)=\left(\prod_{\nu=0}^{r-1}\beta_\nu\right)\cdot\exp\left(\frac{1}{2}\sum_{\nu=0}^{r-1}L(b_\nu^k)b_\nu^k\right) \tag{17}$$

Since the first term does not depend on k, this cannot be taken into account in the estimate of the $Pr(x^k)$. Finally, the APP value of the modulation symbol $x^k$ is deduced from (14), (12) and (17):

$$Pr(x^k|y^\ell)=C'\exp\left(-\frac{N}{2\sigma^2}|z_p|^2+\frac{1}{\sigma^2}\text{Re}(Y_n^\ell\bar{z}_p)+\frac{1}{2}\sum_{\nu=0}^{r-1}L(b_\nu^k)b_\nu^k\right) \tag{18}$$

where C' is a constant independent of k.

The summing block 865 performs the sum of the likelihood term $$-\frac{N}{2}|z_p|^2+\text{Re}(Y_n^\ell\bar{z}_p)$$

received from the deinterleaving module 850 and an a priori probability term (represented by $$\frac{1}{2}\sum_{v=0}^{r-1} L(\hat{b}_v^k)\hat{b}_v^k$$

in the expression (18)) to estimate an a posteriori probability APP, $Pr(x^k|y^t)$. It will be noted that the likelihood term is only calculated once. The a priori information term of a branch $\ell$ is in fact provided by the branch with the index $\ell-1$ as described later.

The APP values are updated by taking requirements induced by the coding trellis into account. The BCJR (also called forward backward algorithm) enables the APP values to be updated from the knowledge of the coding trellis. Alternatively, simplified alternatives of this algorithm such as SOVA (Soft Output Viterbi Algorithm), max-log-MAP algorithm or log-MAP algorithm well known in the state of the art could be used.

The sequence of the successive vectors $y^t$ corresponding to a block is represented in the following by $y=y_0, \ldots, y_{q+L-1}$ and $$L(\hat{b}_v^k) = \log \frac{Pr(b_v^k = +1 \mid y)}{Pr(b_v^k = -1 \mid y)} \quad (19)$$

represents the a posteriori probability logarithmic ratio of the bit $b_v^k$ (given that the sequence y of vectors corresponding to a block have been received).

The relationship is the following:

$$L(\hat{b}_v^k) = \log \frac{\sum_{R_{+1}} p(s, s', y)}{\sum_{R_{-1}} p(s, s', y)} = \log \frac{\sum_{R_{+1}} \alpha_{n-1}(s')\gamma_n(s, s')\beta_n(s)}{\sum_{R_{-1}} \alpha_{n-1}(s')\gamma_n(s, s')\beta_n(s)} \quad (20)$$

where $R_{+1}$ (resp. $R_{-1}$) represents the set of branches in the coding trellis corresponding to $b_v^k=+1$ (resp. $b_v^k=-1$), $\alpha_{\ell-1}(s')=p(s'|y_0, \ldots, y_{n-1})$ is the probability of the state s', given that the received vectors have been $y_0, \ldots, y_{n-1}$, $\gamma_n(s, s')=p(y_n, s|s')$ is the transition probability between the states s and s' at the instant n knowing $y_n$, and $\beta \ell(s)=p(y_{n+1}, \ldots, y_{q+L-1}|s')$ is the probability of observing the vectors $y_{n+1}, \ldots, y_{q+L-1}$ given that at the instant n the coder was in the state s'.

Figure 9:
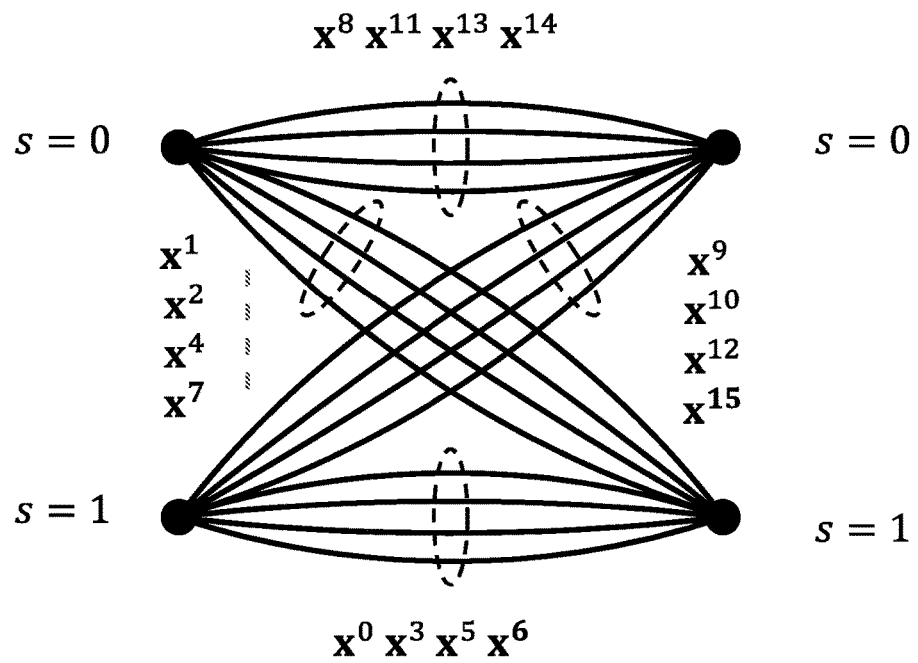
FIG. 9 represents an example of the coding trellis used for an elementary decoder in the branch of the receiver of FIG. 8.

In FIG. 9, an example of the trellis is represented, which is used by an elementary decoder in the branch of the receiver of FIG. 8.

In this example, the length of the shift register of the convolutional coder is L=1 (a single memory location) and the alphabet size M=16. The state s=0 corresponds to a register content equal to 0 and the state s=1 corresponds to a register content equal to 1. The possible states of the elementary coder have been represented at two successive instants n and n+1. The transitions between states have been labelled by the joint modulation symbols $x^k$ transmitted by the modulator 470, that is the words having a size m at the output of the elementary coder. It will be noted that since the elementary coders 430 are identical, the trellis used by the elementary decoders 860 are also identical.

The a posteriori probability logarithmic ratios of the branch $\ell-1$ make up an a posteriori piece of information on the bits for the branch $\ell-1$. This a posteriori piece of information is used as an a priori piece of information for the following branch $\ell$. The a priori piece of information, noted $L\ell$, is interleaved by means of the interleaving module $\Pi \ell^I$, 861, so as to show the LR values, $L(\hat{b}_v^k)$, in the order of the information bits at the input of the corresponding elementary coder. The a priori piece of information after interleaving is noted $L\ell^\pi$.

The a priori piece of information $L\ell^\pi$ is then freed in 862 from the contribution of the branch $\ell$ (called an extrinsic piece of information) obtained at the preceding iteration, that is:

$$(L\ell^\pi)_e = L\ell^\pi - E\ell(t-1) \quad (21)$$

where t is the iteration index and $E\ell(t-1)$ is the extrinsic piece of information obtained at the iteration t-1.

The conversion module 863 calculates the a priori probabilities $Pr(x^k)$ of the different joint modulation symbols from the a priori piece of information on the bits $(L\ell^\pi)$. More precisely, it calculates the a priori probability term $$\frac{1}{2}\sum_{v=0}^{r-1} L(\hat{b}_v^k)\hat{b}_v^k$$

of the expressions (17) and (18) from the LR values, $L(\hat{b}_v^k)$.

The summing module 865 calculates the sum of the likelihood term and the a priori probability term and provides the APP values, $Pr(x^k|y^t)$ to the BCJR decoding module, 867.

The BCJR decoding module 867 gives LLR values, $L(\hat{b}_v^k)$ updated by taking the APP values and the coding trellis into account. These LLR values updated make up an a posteriori piece of information noted $\tilde{L}\ell^\pi$. The extrinsic value $E\ell(t)$ is obtained in 869 by subtracting the a priori piece of information therefrom:

$$E\ell(t) = \tilde{L}\ell^\pi - (L\ell^\pi)_e \quad (22)$$

This extrinsic piece of information thus represents the proper contribution of the decoder in the estimate of the information bits. It is delayed by a delay time 866 corresponding to the iteration period before being subtracted from the a priori piece of information at the next iteration in 862. It is reminded that subtracting the extrinsic piece of information at the input of the decoder enables a self-confirmation of the bits by the latter to be avoided.

Finally, the a posteriori piece of information $\tilde{L}\ell^\pi$ is deinterleaved in the deinterleaving module $(\Pi \ell^I)^{-1}$ 868. This deinterleaved a posteriori piece of information is provided to the elementary decoder of the next branch $\ell+1$ as an a priori piece of information, insofar as the branch following that with the index K-1 is that with the index 0. At the first iteration, the a priori piece of information consists of null LR values (equiprobability of 1 and 0). The initial state and final state of the trellis are those corresponding to a null value of the register (s=0).

When the stop criterion is satisfied, a hard decision is taken on the LR values to give an estimate of the information bits of the block.

Figure 10:
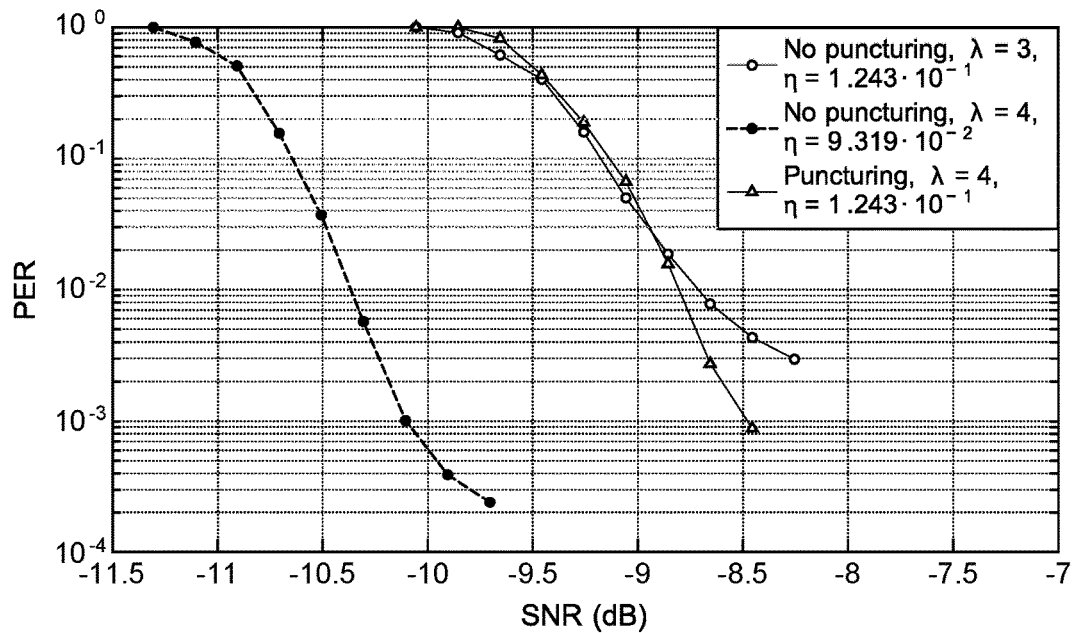
FIG. 10 gives the spectral efficiency as a function of the signal to noise ratio for a transmission system using a transmitter and a receiver according to an exemplary embodiment of the invention.

FIG. 10 gives the spectral efficiency as a function of the signal to noise ratio for a transmission system using a transmitter and a receiver according to one embodiment of the invention.

In this example, the joint modulation is the combination of a FSK orthogonal modulation and a PSK linear modulation. Thus, the number N of orthogonal dimensions of the alphabet is equal to the number of the frequencies and the number P of symbols per dimension is equal to the number of phase shifts. In the figure, it has been considered that the size of the joint modulation alphabet M=NP was constant (M=128) while varying the size N of the orthogonal alphabet and the size P of the linear alphabet. The size Q of the block is chosen equal to 1 000 bits and the number K of branches has been taken equal to 4.

In the figure, the Shannon limit $\eta_{Sh}=f(E_b/N_0)$ has been represented as a function of the signal to noise ratio. The different points labelled by the N and P values are the minimum values of the signal to noise ratio enabling a decoding to be performed without error. By way of comparison, the LTE turbocode performance (PCCC[13 15]) of the state of the art as well as that of the Turbo-FSK scheme (only orthogonal modulation with N=128, no coding) suggested in the abovementioned article have been represented. It is seen that the system according to the invention enables the Shannon limit to be approached on a wide signal to noise ratio range with a good compromise between spectral efficiency (vertical distance to the curve) and energy efficiency (horizontal distance to the curve).

Figure 11:
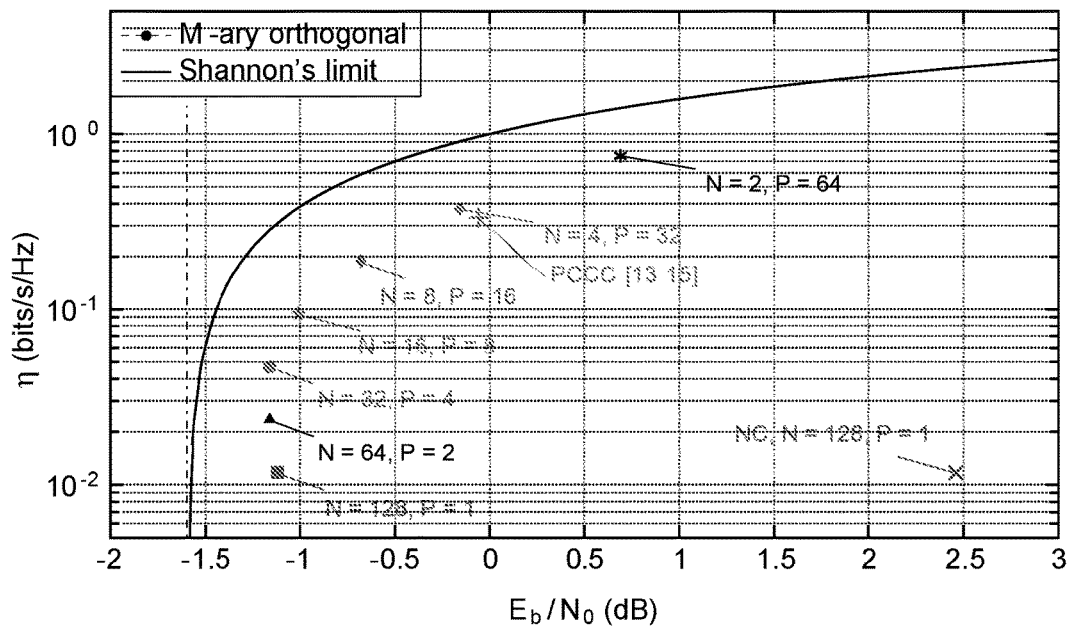
FIG. 11 represents the curve of the packet error rate as a function of the signal to noise ratio for a transmission system using a transmitter and a receiver according to one exemplary embodiment of the invention.

FIG. 11 gives the packet error rate as a function of the signal to noise ratio for a transmission system using a transmitter and a receiver according to an exemplary embodiment of the invention.

The example illustrated corresponds again to a joint modulation having a size M=128, being a combination of a FSK orthogonal modulation (N=8) and a PSK linear modulation (P=16). A size of block Q=1000 has been chosen as in the examples of FIG. 10.

The packet error rate (PER) curves have been represented as a function of the signal to noise ratio (SNR) for the different branch numbers (K=3, K=4) and different puncturing strategies (puncturing $R_{punc}=4/3$ for K=4, absence of puncturing $R_{punc}=1$ for K=3, K=4).

It is noted that, the spectral efficiency is logically identical for a system with K=4 branches and a puncturing $R_{punc}=4/3$ as for a system with K=3 branches. However, the floor of the packet error rate PER is lower in the case of the system with a puncturing on 4 branches than in that of the system without any puncturing on 3 branches.

The example of joint modulation according to the invention, combining a FSK orthogonal modulation and a PSK linear modulation, is particularly interesting insofar as it is compatible with an OFDM waveform, proposed in the narrow band Internet of things (NB-IoT), being an evolution of the 5G for LPWA and IoT networks.

Further, this joint modulation offers the advantage of a constant signal module and consequently of a low PAPR (Peak-to-Average Power Ratio), which results in a low energy consumption of the transmitter.

The invention claimed is:

1. A transmitter for transmitting a block of Q bits, said transmitter comprising a turbocoder receiving said block and providing K code words having m bits, the turbocoder comprising K branches, each branch receiving said block and comprising a first interleaver for interleaving the bits of the block, followed by an elementary coder coding each word having r bits at an output of the first interleaver into a code word having m=r+c bits where c is a non-null integer, the turbocoder being followed by a modulator mapping each code word having m bits at an output of the turbocoder into a symbol of a modulation alphabet A having a size M=$2^m$, the symbols of the modulation alphabet provided by the modulator that modulates the symbols to a signal to be transmitted, wherein the symbols of the modulation alphabet A are distributed on a plurality N of orthogonal dimensions, the symbols carried by a dimension belonging to a linear sub-alphabet $A_n$, having a size P>1, with M=NP, wherein m, Q, M, N, and P are integer values.

2. The transmitter according to claim 1, wherein the elementary coder comprises a convolutional coder with a rate $$\frac{r+1}{m},$$

the elementary coder receiving a word with r bits, calculating a parity bit of said word and concatenating the parity bit to the received word to provide a word with r+1 bits, the convolutional coder coding said word having r+1 bits into a code word having m bits.

3. The transmitter according to claim 1, wherein the code words having m=r+c bits provided by the elementary coder are interleaved by a second interleaver for interleaving the code words.

4. The transmitter according to claim 3, wherein the second interleaver provides the interleaved code words to a puncturer, all puncturers of the different branches performing a word puncturing of the code words with a predetermined puncturing rate $R_{punc}>1$.

5. The transmitter according to claim 1, wherein the modulation symbols of the modulation alphabet A are defined by $x^k=z_p f^x$, $k\in\{0, \ldots, NP-1\}$, where $f^n=(f_0^n, f_1^n, \ldots, f_{N-1}^n)^T$ is a vector having a size N representing a symbol of an orthogonal modulation alphabet and $z_p \in \{z_0, \ldots, z_{P-1}\}$ is a symbol of a linear modulation alphabet.

6. The transmitter according to claim 5, wherein the orthogonal modulation alphabet consists of FSK (Frequency Shift Keying) modulation symbols having a size N.

7. The transmitter according to claim 5, wherein the orthogonal modulation alphabet consists of Hadamard sequences having a size N.

8. The transmitter according to claim 6, wherein the linear modulation alphabet consists of PSK (Phase Shift Keying) symbols having a size P.

9. A receiver for receiving a signal transmitted by the transmitter according to claim 1, the signal received by the receiver being base-band demodulated to provide a block of successive received symbols, the receiver comprising a series-parallel converter receiving the successive received symbols and providing them to a plurality K of parallel branches, the receiver being characterised in that each branch (1) comprises detection circuitry adapted to project a symbol ($y^l$) received on this branch onto the N orthogonal dimensions of the modulation alphabet A to obtain a vector having N components ($Y_0^1, Y_1^1, \ldots, Y_{N-1}^1$) and deduce therefrom as a word having N×P soft values a logarithm of observation probabilities ($\log[p(y^l|x^k)]$) of the received symbol assuming that different symbols of the modulation alphabet have been transmitted, the detection circuitry providing the words thus obtained to an elementary decoder, the elementary decoders of different branches being chained together so as to perform turbodecoding, the turbodecoding providing probability logarithmic ratios (LR), called LR values, for the different information bits of the block, the information bits of the block being estimated by a hard decision on the LR values thus obtained.

10. The receiver according to claim 9, wherein, for a given branch, the words provided by the detection circuitry are depunctured by depuncturing circuitry, the block of words thus depunctured being deinterleaved in word deinterleaving circuitry performing an inverse of the word interleaving performed in the corresponding branch of the transmitter.

11. The receiver according to claim 9, wherein the detection circuitry of a branch l calculates the NP soft values corresponding to a symbol $y^l$ received from $$-\frac{N}{2\sigma^2}|z_p|^2 + \frac{1}{\sigma^2}\mathrm{Re}(Y_n^l \bar{z}_p),$$

$n=0, \ldots, N-1, p=0, \ldots, P-1$, where $Y_n^l$ is a component of the received symbol $y^l$, on an $n^{th}$ dimension of the modulation alphabet, $z_p$ is a linear modulation symbol carried by the $n^{th}$ dimension of the modulation alphabet, $\bar{z}_p$, is a conjugate of $z_p$, and $\sigma^2$ is a noise power received.

12. The receiver according to claim 11, wherein the orthogonal modulation is a FSK (Frequency Shift Keying) modulation and in that the components $Y_n^l$ of the received symbol $y^l$ are obtained by correlating the received symbol with different rows of a DFT (Discrete Fourier Transform) matrix having a size N×N.

13. The receiver according to claim 11, wherein the orthogonal modulation is a Hadamard modulation and in that the components $Y_n^l$ of the received symbol $y^l$ are obtained by correlating the received symbol with different rows of a Hadamard matrix having a size N×N.

14. The receiver according to claim 11, wherein the elementary decoder of a branch l comprises a summing block performing the sum of the NP soft values $$-\frac{N}{2\sigma^2}|z_p|^2 + \frac{1}{\sigma^2}\mathrm{Re}(Y_n^l \bar{z}_p),$$

$n=0, \ldots, N-1, p=0, \ldots, P-1$ of a word and of an a priori piece of information provided on the modulation symbols representing the a priori probability that the different modulation symbols have been transmitted, to give an a posteriori piece of information representing the probability that the different modulation symbols have been transmitted in view of an observation of the symbol $y^l$ received by the branch l.

15. The receiver according to claim 14, wherein the a priori piece of information on the modulation symbols is obtained by conversion circuitry from an a priori piece of information on the information bits provided by the branch l-1.

16. The receiver according to claim 15, wherein the elementary decoder of a branch l further comprises BCJR decoding circuitry using a coding trellis of the elementary coder corresponding to the transmitter to determine, from the a posteriori piece of information on the different symbols, the a posteriori piece of information on the different information bits representing the a posteriori probability of said different information bits.

17. The receiver according to claim 15, wherein the a priori piece of information on the different information bits provided by the branch l-1 is subtracted from the a posteriori piece of information on the different information bits to determine an extrinsic piece of information, said extrinsic piece of information being subtracted from a following iteration of the a priori piece of information on the different information bits at the input of the conversion circuitry.

* * * * *